United States Patent
Hattori et al.

(10) Patent No.: US 8,294,165 B2
(45) Date of Patent: Oct. 23, 2012

(54) SEMICONDUCTOR LIGHT-EMITTING DEVICE

(75) Inventors: Yasushi Hattori, Kawasaki (JP); Shinya Nunoue, Ichikawa (JP); Genichi Hatakoshi, Yokohama (JP); Shinji Saito, Yokohama (JP); Naomi Shida, Tokyo (JP); Masahiro Yamamoto, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 551 days.

(21) Appl. No.: 11/668,218

(22) Filed: Jan. 29, 2007

(65) Prior Publication Data

US 2007/0228390 A1    Oct. 4, 2007

(30) Foreign Application Priority Data

Mar. 30, 2006    (JP) .................................. 2006-094875

(51) Int. Cl.
- H01L 33/50    (2010.01)
- H01L 33/54    (2010.01)
- H01L 33/56    (2010.01)

(52) U.S. Cl. .................. 257/98; 257/100; 257/E33.059; 257/E33.061; 313/503; 313/512

(58) Field of Classification Search ............ 257/79–103, 257/E33.059, E33.061; 438/22–47; 313/498–512
See application file for complete search history.

(56) References Cited

U.S. PATENT DOCUMENTS

| | | | |
|---|---|---|---|
| 5,962,971 A | | 10/1999 | Chen |
| 6,657,382 B2 * | | 12/2003 | Nagai et al. .................... 313/512 |
| 6,734,465 B1 * | | 5/2004 | Taskar et al. .................... 257/80 |
| 6,898,014 B2 * | | 5/2005 | Ohgaki .......................... 359/619 |
| 6,960,878 B2 * | | 11/2005 | Sakano et al. ................. 313/512 |
| 7,019,335 B2 * | | 3/2006 | Suenaga .......................... 257/99 |
| 7,352,011 B2 * | | 4/2008 | Smits et al. ..................... 257/99 |
| 7,354,785 B2 * | | 4/2008 | Kabay et al. .................... 438/47 |
| 7,388,232 B2 * | | 6/2008 | Suehiro et al. .................. 257/98 |
| 7,635,873 B2 * | | 12/2009 | Harada ............................ 257/95 |
| 7,868,343 B2 * | | 1/2011 | Negley et al. ................... 257/99 |
| 7,939,843 B2 * | | 5/2011 | Haruna et al. ................... 257/98 |
| 2003/0132701 A1 * | | 7/2003 | Sato et al. ..................... 313/503 |
| 2004/0227149 A1 * | | 11/2004 | Ibbetson et al. .............. 257/100 |
| 2004/0256706 A1 * | | 12/2004 | Nakashima .................... 257/678 |

(Continued)

FOREIGN PATENT DOCUMENTS

JP    50-79379    11/1973

(Continued)

OTHER PUBLICATIONS

U.S. Appl. No. 12/299,186, filed Oct. 31, 2008, Hwang, et al.

(Continued)

*Primary Examiner* — Matthew W Such
*Assistant Examiner* — Eric Ward
(74) *Attorney, Agent, or Firm* — Oblon, Spivak, McClelland, Maier & Neustadt, L.L.P.

(57) ABSTRACT

A light-emitting device is provided, which includes a substrate having a plane surface, a semiconductor light-emitting element mounted on the plane surface of the substrate and which emits light in a range from ultraviolet ray to visible light, a first light transmissible layer formed above the substrate and covering the semiconductor light-emitting element, a phosphor layer formed above the first light transmissible layer and containing phosphor particles and matrix, and a second light transmissible layer formed above the phosphor layer and contacting with the plane surface of the substrate. The surface of the phosphor layer has projections reflecting shapes of the phosphor particles.

12 Claims, 6 Drawing Sheets

U.S. PATENT DOCUMENTS

| | | | |
|---|---|---|---|
| 2005/0057144 A1* | 3/2005 | Morita et al. | 313/501 |
| 2005/0133808 A1* | 6/2005 | Uraya et al. | 257/99 |
| 2005/0211991 A1* | 9/2005 | Mori et al. | 257/79 |
| 2006/0055309 A1* | 3/2006 | Ono et al. | 313/492 |
| 2006/0081814 A1 | 4/2006 | Shida et al. | |
| 2006/0255353 A1* | 11/2006 | Taskar et al. | 257/98 |
| 2006/0255716 A1* | 11/2006 | Tsutsumi et al. | 313/502 |
| 2007/0001568 A1* | 1/2007 | Kaneko et al. | 313/112 |
| 2007/0013304 A1* | 1/2007 | Kaneko et al. | 313/512 |

FOREIGN PATENT DOCUMENTS

| | | |
|---|---|---|
| JP | 7-99345 | 4/1995 |
| JP | 10-56208 | 2/1998 |
| JP | 10-173241 | 6/1998 |
| JP | 11-87778 | 3/1999 |
| JP | 11-163397 | 6/1999 |
| JP | 11-214752 | 8/1999 |
| JP | 2000-31531 | 1/2000 |
| JP | 2001-44514 | 2/2001 |
| JP | 2001-203392 | 7/2001 |
| JP | 2002-42525 | 2/2002 |
| JP | 2002-118293 | 4/2002 |
| JP | 2002-241586 | 8/2002 |
| JP | 2002-359404 | 12/2002 |
| JP | 2003-224306 | 8/2003 |
| JP | 2004-6227 | 1/2004 |
| JP | 2004-48040 | 2/2004 |
| JP | 2004-80058 | 3/2004 |
| JP | 2004-87812 | 3/2004 |
| JP | 2004-111882 | 4/2004 |
| JP | 2004-266148 | 9/2004 |
| JP | 2004-273798 | 9/2004 |
| JP | 2005-197509 | 7/2005 |
| JP | 2005-232311 | 9/2005 |
| JP | 2005-272484 | 10/2005 |
| JP | 2005-276883 | 10/2005 |
| JP | 2005-276976 | 10/2005 |
| JP | 2005-277127 | 10/2005 |
| JP | 2005-332963 | 12/2005 |
| JP | 2006-13347 | 1/2006 |
| JP | 2006-32726 | 2/2006 |

OTHER PUBLICATIONS

U.S. Appl. No. 11/561,670, filed Nov. 20, 2006, Masahiro Yamamoto, et al.
U.S. Appl. No. 12/401,692, filed Mar. 11, 2009, Mitsuishi, et al.
U.S. Appl. No. 12/874,839, filed Sep. 2, 2010, Hikosaka, et al.
U.S. Appl. No. 12/874,413, filed Sep. 2, 2010, Hikosaka, et al.
U.S. Appl. No. 13/033,911, filed Feb. 24, 2011, Ishida, et al.
Official Letter of Inquiry (with English translation) for Patent Application No. 2006-94875).
Office Action issued Jul. 17, 2012 in Japan Application No. 2006-94875 filed Mar. 30, 2006 (with English Translation), 17 pgs.
Office Action issued Jul. 31, 2012 in Patent Application No. 2010-135243 filed Jun. 17, 2010 (with English Translation); 4 pgs.

* cited by examiner

SEMICONDUCTOR LIGHT-EMITTING DEVICE

CROSS-REFERENCE TO RELATED APPLICATIONS

This application is based upon and claims the benefit of priority from prior Japanese Patent Application No. 2006-094875, field Mar. 30, 2006, the entire contents of which are incorporated herein by reference.

BACKGROUND OF THE INVENTION

1. Field of the Invention

This invention relates to a semiconductor light-emitting device.

2. Description of the Related Art

In order to obtain an LED that emits white light homogeneous and superior in color tone at a wide projection angle, it is proposed that a resin layer not containing a phosphor particles, a resin layer containing a phosphor particles, and a resin layer not containing a phosphor particles are successively formed on an LED chip. Furthermore, it is proposed that a resin layer having light transmissibility, the phosphor layer, and a resin layer having light transmissibility are successively formed on a semiconductor light-emitting chip. In these semiconductor light-emitting devices, a substrate having a recess is used, and a resin layer is arranged in the recess.

On the other hand, as a semiconductor light-emitting device using a substrate having a plane surface, a white light-emitting diode in which a phosphor layer having a semi-circular cross-sectional shape and a light transmissible resin layer are successively formed on a LED chip is disclosed. Furthermore, a semiconductor light-emitting device in which a light transmissible inorganic layer having a square cross-sectional shape and a phosphor layer are formed on a LED chip is proposed.

Furthermore, a white semiconductor light-emitting device having a buffer layer and a phosphor layer are successively formed on a chip is proposed. In this light-emitting device, by arranging the phosphor layer on a surface separately, color ununiformity on an emission observation surface is reduced.

BRIEF SUMMARY OF THE INVENTION

A light-emitting device according to one aspect of the present invention comprises a substrate having a plane surface; a semiconductor light-emitting element mounted on the plane surface of the substrate and which emits light in a range from ultraviolet ray to visible light; a first light transmissible layer which covers the semiconductor light-emitting element and contacting with the plane surface of the substrate; a phosphor layer which covers the first light transmissible layer, the phosphor layer contacting with the plane surface of the substrate and containing phosphor particles and matrix, a surface of the phosphor layer having projections reflecting shapes of the phosphor particles; and a second light transmissible layer which covers the phosphor layer and contacting with the plane surface of the substrate.

A light-emitting device according to another aspect of the present invention comprises a substrate having a plane surface; a semiconductor light-emitting element mounted on the plane surface of the substrate and which emits light in the range from ultraviolet ray to visible light; a first light transmissible layer which covers the semiconductor light-emitting element and contacting with the plane surface of the substrate; a phosphor layer which covers the first light transmissible layer, the phosphor layer contacting with the plane surface of the substrate and containing phosphor particles and matrix, a concentration of the phosphor particles being 20 wt % or more; and a second light transmissible layer which covers the phosphor layer and contacting with the plane surface of the substrate.

DETAILED DESCRIPTION OF THE INVENTION

Embodiments of the present invention will be explained in the following.

The inventors focused on loss of light extraction efficiency in a conventional semiconductor light-emitting device. The loss of light extraction efficiency can be rephrased by reduction of luminescence efficiency, and the cause is found that a part of the light extracted from the chip is scattered by a wavelength converting material (phosphor particles) or is reflected totally on a resin-air boundary interface, and is absorbed in the resin (by wavelength converting material or semiconductor light-emitting chip itself). Such total reflection also occurs in a wavelength converting material-air boundary interface, and a part of the light is absorbed in the resin similarly.

Furthermore, in the case a package cup is used in order to arrange the phosphor particles in the phosphor layer homogeneously, a light-emitting surface becomes wide since it becomes the whole cup. As a result, obtained luminance becomes low. Furthermore, absorption by the cup becomes also a cause of reduction of efficiency.

Based on such findings, the inventors have found that in order to improve the luminescence efficiency (light extraction efficiency) and luminance, it is effective that comprising the substrate having the plane surface and at least two light transmissible layers sandwiching the phosphor layer to accomplish this invention.

Hereinafter, embodiments are explained in detail with reference to the drawings. The same sign is attached to a constitutional chip having the same function in the embodiment, and a duplicated explanation is abbreviated.

Figure 1:
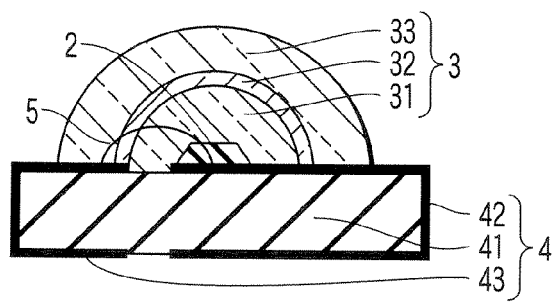
FIG. 1 is a cross-sectional view illustrating a semiconductor light-emitting device according to one embodiment.

As shown in FIG. 1, in the semiconductor light-emitting device in this embodiment, the semiconductor light-emitting chip 2 is mounted on a plane surface for the semiconductor light-emitting chip of the substrate 4 to be mounted, and on the semiconductor light-emitting chip 2, a multilayered structure 3 including a first light transmissible layer 31, the phosphor layer 32, and a second light transmissible layer 33 is formed. The semiconductor light-emitting chip 2 emits light within a range from ultraviolet light to visible light. Furthermore, all the layers of the first light transmissible layer 31, the phosphor layer 32, and the second light transmissible layer 33 contact the plane surface of the substrate 4.

In the semiconductor light-emitting device of this embodiment, since the substrate is not the package cup but the plane surface, there is no risk of absorption by the cup occurring. As a result, it leads to improvement of light extraction efficiency. In addition, a small point light source corresponding to a size of the semiconductor light-emitting chip is enabled, and it is possible to output high luminance.

Incidentally, the substrate 4 having the plane surface includes a substrate base material 41 as a main body, and a wiring 42 and a wiring 43 formed on this substrate base material 41. As the substrate base material 41, for instance, a flat plate base material can be used. As a flat plate substrate, a convex part may be formed in a prescribed region. Otherwise, the flat plate substrate having a groove in a prescribed region can be used. Such a flat plate substrate will be described later. The wiring 42 is formed on the top surface center or the bottom surface center of the substrate base material 41, and both are electrically connected by a through hole wiring. On the other hand, the wiring 43 is formed on the top surface periphery and the bottom surface periphery of the substrate base material 41, and both are electrically connected by the through hole wiring.

The wiring 43 is electrically connected to the main electrode of the semiconductor light-emitting chip 2 (not shown) via a wire 5. For instance, in the case a flip chip is used, depending on a structure of the semiconductor light-emitting chip 2, the wire 5 is not necessarily needed. Furthermore, in the case both of the two main electrodes of the semiconductor light-emitting chip 2 are positioned on the top surface, the wirings 42, 43 are electrically connected to the respective electrodes via the wire. The substrate 4 and the wire 5 are not limited to a shown example.

Figure 2:
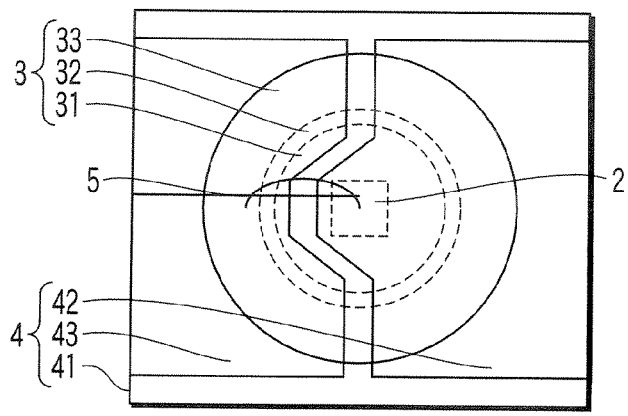
FIG. 2 is a plan view of the semiconductor light-emitting device shown in FIG. 1.

As shown in FIG. 2, in the semiconductor light-emitting device of this embodiment, the multilayered structure 3 including the first light transmissible layer 31, the phosphor layer 32, and the second light transmissible layer 32 surrounds hemispherically the semiconductor light-emitting chip 2.

As the substrate base material 41, a material superior in thermal conductivity is preferable. For instance, AlN, $Al_2O_3$, Cu, BN, plastics, ceramics, and diamond are listed. By using the substrate base material formed of such materials, heat generated from the semiconductor light-emitting chip 2 can be radiated efficiently. The wirings 42 and 43 are preferable formed by a material low in both of the wiring resistance and the absorptvity. For instance, the wirings 42, and 43 can be formed by the material comprising Au, Ag, Cu, Cu alloy or W. These wirings may be either a thin film wiring or a thick film wiring. Furthermore, in order to improve bondability, an Au plating layer, an Ag plating layer, a Pd plating layer, or a soldering plating layer can be formed on the wirings 42 and 43.

For the wire 5, a material small in resistance and small in absorptivity of the visible light is used preferably. For instance, an Au wire can be used. Otherwise, the wire combining a noble metal such as Pt and Au may be used.

For instance, as the semiconductor light-emitting chip 2, the light-emitting diode having AlGaInN light-emitting layer (or AlGaInN active layer) 205 that is III group nitride based compound semiconductor can be employed. That one example is shown in FIG. 3.

For instance, III group nitride based compound semiconductor can be expressed by a general formula $Al_XGa_YIn_{1-X-Y}N$ ($0 \leq X \leq 1$, $0 \leq Y \leq 1$, $0 \leq X+Y \leq 1$). In such a general formula, compound semiconductor of binary system of AlN, GaN, or InN and ternary system of $Al_XGa_{1-X}N$, $Al_XIn_{1-X}N$, or $Ga_XIn_{1-X}N$ ($0<x<1$) are included also. In III group nitride based compound semiconductor, a part of III group chip can be substituted by B or Tl or the like. Furthermore, in the III group nitride based compound semiconductor, also a part of N can be substituted by P, As, Sb or Bi or the like.

Figure 3:
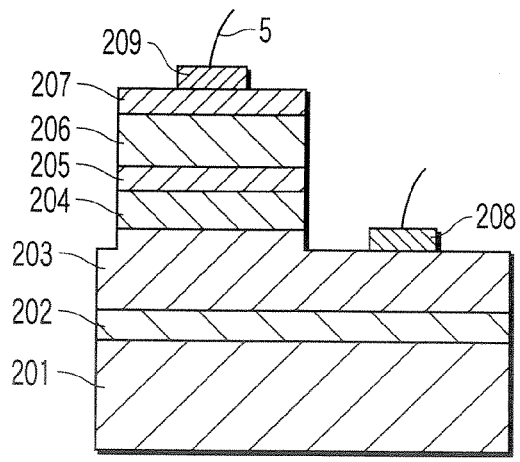
FIG. 3 is a cross-sectional view illustrating relevant part of a semiconductor light-emitting chip in the semiconductor light-emitting device according to one embodiment.

In a semiconductor light-emitting chip shown in FIG. 3, AlGaInN buffer layer 202, n-type AlGaInN contact layer 203, n-type AlGaInN clad layer 204, AlGaInN light-emitting layer 205, p-type AlGaInN clad layer 206, and p-type AlGaInN contact layer 207 are successively formed on a sapphire substrate 201. An n-type electrode (first main electrode) 208 is formed on n-type AlGaInN contact layer 203, and p-type electrode (second main electrode) 209 is formed on p-type AlGaInN contact layer 207. However, the layer structure is not only limited to description of the embodiment shown in FIG. 3. For instance, a conductive substrate made of GaN or the like is used as substrate 201, and an electrode 208 may be formed under the substrate 201.

Figure 4:
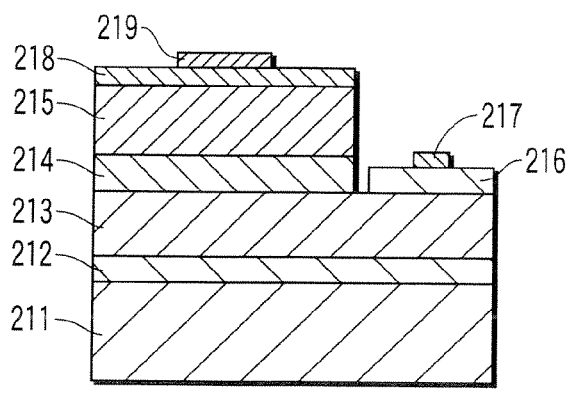
FIG. 4 is a cross-sectional view illustrating relevant part of the semiconductor light-emitting chip in the semiconductor light-emitting device according to other embodiment.

As the semiconductor light-emitting chip 2, a laser diode or light-emitting diode having MgZnO light-emitting layer (or MgZnO active layer) can be used. The general formula is expressed by $Mg_XZn_{1-X}O$ ($0 \leq X \leq 1$). One example of the semiconductor light-emitting chip including such a light-emitting layer is shown in FIG. 4.

In the shown semiconductor light-emitting chip, ZnO buffer layer 212, p-type MgZnO layer 213, MgZnO light-emitting layer 214, and n-type MgZnO layer 215 are formed on a sapphire substrate 211. A metal-electrode (first main electrode) 217 is formed on p-type MgZnO layer 213 via an ITO electrode layer 216, and a metal-electrode (second main electrode) 219 is formed on n-type MgZnO layer 215 via an ITO electrode layer 218. However, the layer structure is not limited to the embodiment shown in FIG. 4.

Figure 5:
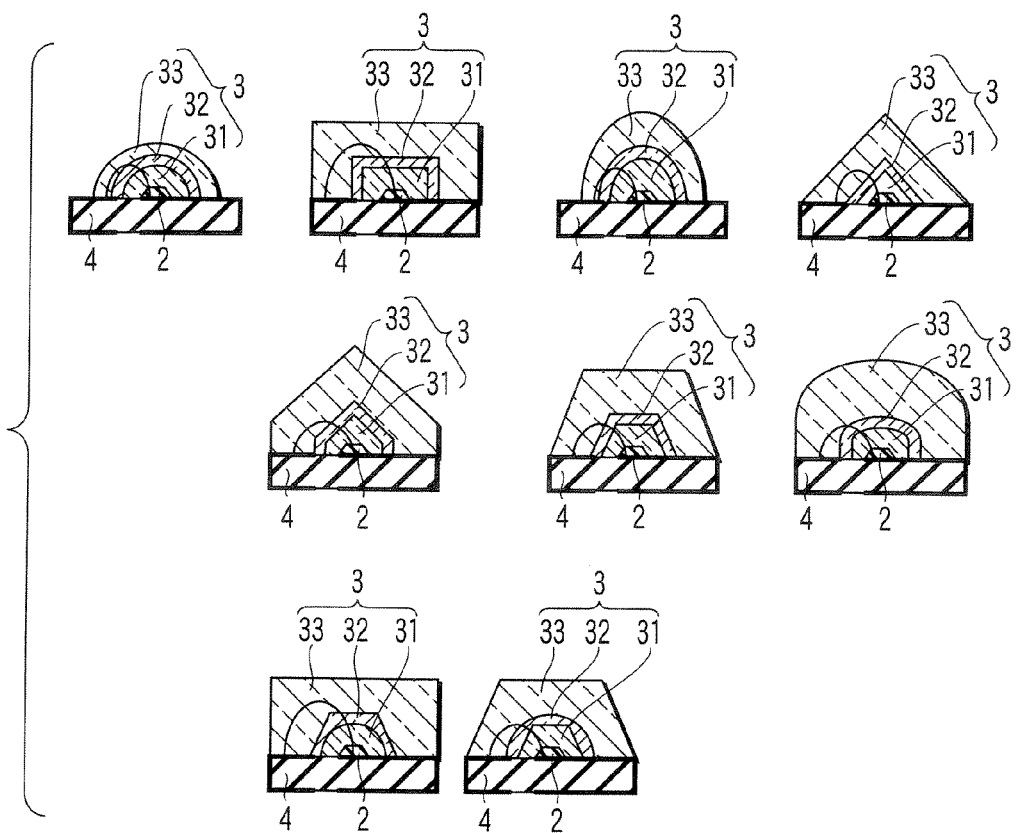
FIG. 5 is a cross-sectional vies illustrating variation of a multilayered structure in the semiconductor light-emitting device according to one embodiment.

An example of a cross-sectional shape of a laminating structure 3 including the first light transmissible layer 31, the phosphor layer 32, and the second light transmissible layer 33 is shown in FIG. 5. As shown in the drawing, a variety of shapes can be adopted. A shape of an outer periphery in the cross-section perpendicular to the substrate can be either semi-arc-shaped, parabolic-shaped, or U-shaped, or cornered shaped having at least two straight lines. For instance, in the case the outer periphery of the cross-sectional face of the laminating structure 3 is cornered-shaped having two straight lines, the cross-section perpendicular to the substrate of the laminating structure 3 become to have a triangular shape by this outer periphery and the plane surface of the substrate 4. In the case the outer periphery of the cross-sectional face is cornered-shaped having three straight lines, the shape of the cross-sectional face can be rectangular or trapezoidal.

More specifically, a shape of an inner periphery of the cross-section of the phosphor layer may be either semi-arc-shaped, palabola-shaped, or U-shaped, or cornered-shaped having at least two straight lines. Shapes of outer periphery of the cross-section of the first light transmissible layer and the second light transmissible layer may be either semi-arc-shaped, palabola-shaped, or U-shaped, or cornered-shaped having at least two straight lines.

The respective outer periphery in the cross-section perpendicular to the substrate of the first transmissible layer 31, the phosphor layer 32 and the second light transmissible layer 33 does not necessarily need to have the same shape.

Even in the case the first light transmissible layer 31, the phosphor layer 32 and the second light transmissible layer 33 are formed in either shape shown in FIG. 5, the total reflection in the boundary of the second light transmissible layer 33 and air is reduced, and light absorption by this second light transmissible layer is reduced. Therefore, efficiency and luminance of the semiconductor light-emitting device of the embodiment is improved.

Figure 6:
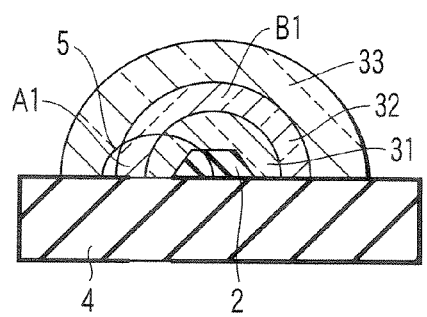
FIG. 6 is a cross-sectional view illustrating the semiconductor device according to one embodiment.
Figure 7A:
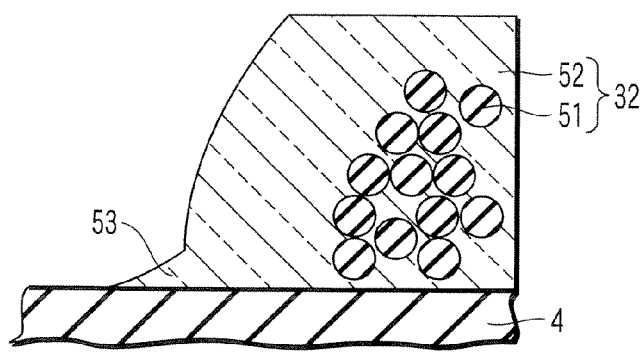
FIGS. 7A and 7B is a diagram drawing showing a state of a phosphor layer.
Figure 7B:
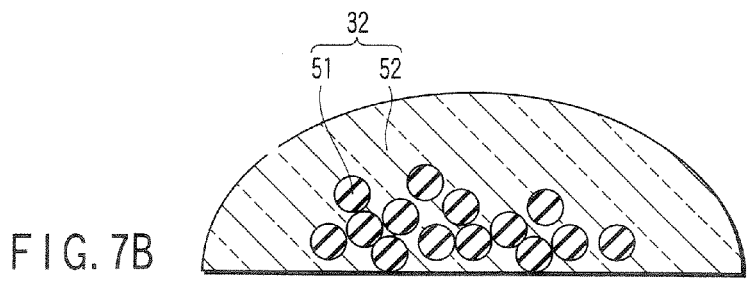

Its mechanism is explained with reference to the drawings. For a trailing part (region A1) and a top part (region B1) of the phosphor layer 32 in FIG. 6, a state of dispersion of the phosphor particles is shown respectively in FIG. 7A and FIG. 7B. FIG. 7A shows the state of the trailing part (region A1) in contact with the substrate 4 and FIG. 7B shows the state of the top part (region B1).

As shown in FIG. 7A, the phosphor layer 32 is constituted of the matrix (base matrix) 52 and the phosphor particles 51 dispersed in this matrix. Here, the case of using a resin as the matrix 52 is described. In the semiconductor light-emitting device in the embodiment, since the second light transmissible layer 33 is further formed on the phosphor layer 32, as shown in FIG. 7A, a trailing 53 of the resin in the trailing part is reduced. In addition, the second light transmissible layer 33 exists on the phosphor layer 32, a distance between the phosphor particles 51 and air becomes larger. As a result, the effect of the total reflection at the phosphor particles-air boundary is small. On the other hand, at the top part of the laminating structure as shown in FIG. 7B, the shape of the phosphor particles 51 is never reflected on a surface. Since the second light transmissible layer 33 exists, smoothness of the surface of the multilayered structure is superior. By this, the total reflection is reduced, and it is possible to improve light extraction efficiency. Such a structure has been achieved by the inventors.

Figure 8:
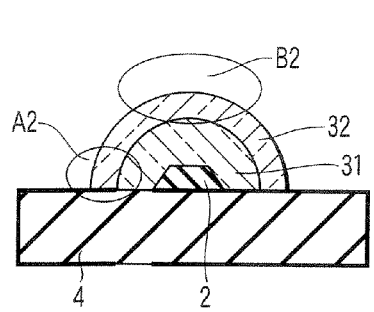
FIG. 8 is a cross-sectional view illustrating a conventional semiconductor light-emitting device.
Figure 9A:
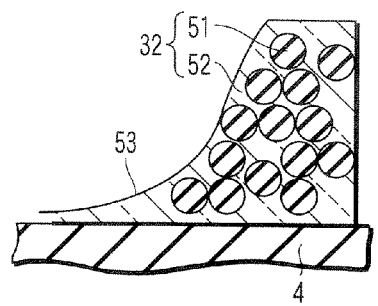
FIGS. 9A and 9B is a diagram drawing showing a state of a phosphor layer.
Figure 9B:
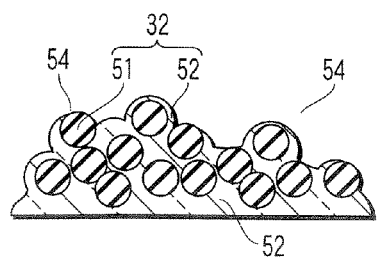

A conventional structure is explained with reference to FIG. 8, and FIGS. 9A, 9B. As shown in FIG. 8, the phosphor layer 32 formed on the light transmissible layer 31 is in contact with air. Therefore, in the trailing part (A2) of this phosphor layer 32, as shown in FIG. 9A, the trailing 53 of the resin occurs largely. Such trailing leads to reduction of luminescence efficiency due to the total reflection/re-absorption increase. On the other hand, at the top part of the laminating structure as shown in FIG. 9B, unevenness reflecting the shape of the phosphor particles 51 occurs on the surface. The uppermost surface has unevenness by this and efficiency is reduced due to the total reflection/re-absorption increase.

In either of the trailing part and the top part, a cause of reduction of efficiency has occurred in the conventional structure. In the semiconductor light-emitting device of this embodiment, it has become possible to evade such a cause.

The first light transmissible layer 31 can be formed using resin or a glass layer having light transmissibility. As the resin, an arbitrary resin high in light transmissibility and strong in heat can be used. For instance, either one of silicone resin, epoxy resin, urea resin, fluororesin, acrylic resin, polyimide resin, or glass can be used. Especially, the epoxy resin or the silicone resin are the most suitable since they are easily available, easy to handle, and inexpensive.

The shape of the outer periphery in the cross-section perpendicular to the substrate of the first light transmissible layer 31 can be either one of semi-arc-shaped, parabolic-shaped, or U-shaped, or cornered shape having at least two straight lines. Thickness of the first light transmissible layer 31 is not especially limited as long as it is equal or more than large enough to completely cover the semiconductor light-emitting chip 2. The width of the bottom surface including the semiconductor light-emitting chip 2 in contact with the substrate 4 is from 200 to 500 μm. Furthermore, the height is within from 0.25 times to one time as much as the width of the bottom surface. As long as it is within this range, the light extraction efficiency from the semiconductor light-emitting chip 2 to outside (outside of device) of the phosphor layer 32 and the second light transmissible layer 33 can be improved sufficiently.

Since the first light transmissible layer 31 exists, the distance between the phosphor particles contained in the phosphor layer 32 and the semiconductor light-emitting chip 2 becomes larger. As a result, film thickness of the phosphor layer can be adjusted. Furthermore, by adjusting the phosphor layer to have the optimum thickness, it is possible to prevent re-absorption by the phosphor particles and to improve luminescence efficiency. In addition, since the first light transmissible layer 31 is formed between the phosphor layer 32 and the semiconductor light-emitting chip 2, re-absorption is reduced.

The phosphor layer 32 can be formed by raw material prepared by adding a phosphor material (phosphor particles) into a matrix. As the matrix, an arbitrary material high in both of light transmissibility and heat resistance can be used. For instance, silicone resin, epoxy resin, urea resin, fluororesin, acrylic resin, or polyimide resin can be used as the matrix. Epoxy resin or silicone resin are the most suitable especially since they are easily available, easy to handle and inexpensive.

Besides the resins, glass, sintered material, ceramic structure combining YAG and $Al_2O_3$ or the like can be used as the matrix. As the matrix, the same material as the above mentioned first light transmissible layer 31 is preferably used. Refractive index of the matrix is the same as that of the first light transmissible layer 31. It is desirable that the refractive index of the matrix is lower than that of the first light transmissible layer 31 and higher than that of the second light transmissible layer 33.

The shape of the outer periphery in the cross-section perpendicular to the substrate of the phosphor layer 32 can be either one of semi-arc-shaped, parabolic-shaped, or U-shaped, or cornered shaped having at least two straight lines. The thickness of the phosphor layer 32 is not limited as long as it is equal or more than large enough to completely cover the semiconductor light-emitting chip 2 and the first light transmissible layer 31. It is desirable that the thickness of the phosphor layer 32 is within from 20 to 300 μm.

The phosphor materials are substance to absorb light within a region from ultraviolet to blue and to emit visible light. Specifically, either one of the phosphor materials such as silicate based phosphor material, aluminate based phosphor material, nitride based phosphor material, sulfide based phosphor material, oxysulfide based phosphor material, YAG based phosphor material, phosphate borate based phosphor material, phosphate based phosphor material, and halophosphate based phosphor material can be used.

(1) Silicate Based Phosphor Material: $(Sr_{1-x-y-z}Ba_xCa_yEu_z)2Si_wO_{2+2w}$
$(0 \leq x \leq 1, 0 \leq y \leq 1, 0.05 \leq z \leq 0.2, 0.90 \leq w \leq 1.10)$ wherein the composition of x=0.19, y=0, z=0.05, w=1.0 is desirable.

As the above described silicate phosphor material, at least a part of Sr, Ba or Ca may be substituted by at least one selected from the group consisting of Mg, Be and Zn. By this, the stability of crystal structure and light emission strength can be raised more.

As silicate based phosphor material having other composition ratio, $MSiO_3$, $MSiO_4$, $M_2SiO_3$, $M_2SiO_5$, and $M_4Si_2O_8$ (M is selected from the group consisting of Sr, Ba, Ca, Mg, Be, Zn, and Y) can be given.

As the above described silicate based phosphor material, by substituting at least a part of Si by Ge, luminous color can be controlled. For instance, $(Sr_{1-x-y-z}Ba_xCa_yEu_z)2(Si_{1-u}Ge_u)O_4$ is given.

Furthermore, at least one selected from Ti, Pb, Mn, As, Al, Pr, Tb, and Ce may be contained as an activator.

(2) Aluminate Based Phosphor Material: $M_2Al_{10}O_{17}$
M is at least one selected from a group consisting of Ba, Sr, Mg, Zn, and Ca, and contains at least one of Eu and Mn as an activator.

As silicate based phosphor material having other composition ratio, $MAl_2O_4$, $MAl_4O_{17}$, $MAl_8O_{13}$, $MAl_{12}O_{19}$, $M_2Al_{10}O_{17}$, $M_2Al_{11}O_{19}$, $M_3Al_5O_{12}$, $M_3Al_{16}O_{27}$, and $M_4Al_5O_{12}$ are given. M is at least one selected from a group consisting of Ba, Sr, Ca, Mg, Be, and Zn. Furthermore, at least one selected from the group consisting of Mn, Dy, Tb, and Nd. Ce may be contained as an activator.

(3) Nitride Based Phosphor Material (Mainly, Silicon Nitride Based Phosphor Material): $L_XSi_YN_{(2/3X+4/3Y)}$:Eu or $L_XSi_YO_ZN_{(2/3X+4/3Y-2/3Z)}$:Eu
L is selected from the group consisting of Sr, Ca, Sr, and Ca. It is preferable that X=2 and Y=5, or X=1 and Y=7, but X and Y can have an arbitrary value.

Specifically, it is preferable that phosphor materials expressed by $(Sr_XCa_{1-X})_2Si_5N_8$:Eu, $Sr_2Si_5N_8$:Eu, $Ca_2Si_5N_8$:Eu, $Sr_XCa_{1-X}Si_7N_{10}$:Eu, $SrSi_7N_{10}$:Eu, $CaSi_7N_{10}$:Eu into which Mn is added as a basic constituent. In such a phosphor material, at least one selected from the group consisting of Mg, Sr, Ca, Ba, Zn, B, Al, Cu, Mn, Cr, and Ni may be contained. Furthermore, at least one selected from the group consisting of Ce, Pr, Tb, Nd, and La may be contained as an activator.

(4) Sulphide Based Phosphor Material: $(Zn_{1-x}Cd_x)S$:M
X is a value satisfying $0 \leq x \leq 1$. M is at least one selected from the group consisting of Cu, Cl, Ag, Al, Fe, Cu, Ni, and Zn. S may be substituted by at least one of Se and Te.

(5) Oxysulphide Phosphor Material: $(Ln_{1-x}Eu_x)O_2S$
Ln is at least one selected from the group consisting of Sc, Y, La, Gd, and Lu, and X is a value satisfying $0 \leq X \leq 1$. Furthermore, at least one selected from the group consisting of Tb, Pr, Mg, Ti, Nb, Ta, Ga, Sm, and Tm may be contained as an activator.

(6) YAG Based Phosphor Material: $(Y_{1-x-y-z}Gd_xLa_ySm_z)3(Al_{1-y}Ga_y)_5O_{12}$:Ce, Eu
$(0 \leq x \leq 1, 0 \leq y \leq 1, 0 \leq z \leq 1, 0 \leq v \leq 1)$
At least one of Cr and Tb may be contained as an activator.

(7) Borate Based Phosphor:
$MBO_3$:Eu (M is at least one selected from the group consisting of Y, La, Gd, Lu, and In. As an activator, Tb may be contained).

As borate based phosphor material having other composition ratio, $Cd_2B_2O_5$:Mn, (Ce, Gd, Tb)$MgB_5O_{10}$:Mn, $GdMgB_5O_{10}$:Ce, Tb or the like is given.

(8) Phosphate Borate Based Phosphor Material: $2(M_{1-x}M'_x)O.aP_2O_5.bB_2O_3$
M is at least one selected from the group consisting of Mg, Ca, Sr, Ba, and Zn, and M' is at least one selected from the group consisting of Eu, Mn, Sn, Fe, and Cr. x, a, b is a value satisfying $0.001 \leq x \leq 0.5$, $0 \leq a \leq 2$, $0 \leq b \leq 3$, and $0.3 \leq a+b$.

(9) Phosphate Based Phosphor Material: $(Sr_{1-x}Ba_x)3(PO_4)_2$:Eu, $(Sr_{1-x}Ba_x)_2P_2O_7$:Eu, Sn
Ti may be contained as an activator.

(10) Halophosphate Based Phosphor Material: $(M_{1-x}Eu_x)10(PO_4)_6Cl_2$, $(M_{1-x}Eu_x)5(PO_4)_3Cl$
M is at least one selected from the group consisting of Ba, Sr, Ca, Mg, and Cd. x is a value satisfying $0 \leq x \leq 1$. At least a part of Cl may be substituted by F.

At least one of Sb and Mn may be contained as an activator.

At least two kinds of the phosphor material is blended and an inorganic phosphor material emitting light of a neutral color can be manufactured. For instance, by mixing coloring materials having colors corresponding respectively to RGB and manufacturing the matrix, the phosphor material enabling to obtain a white light can be obtained. Also in the case of mixing the phosphor material, the phosphor enabling to obtain the white light can be manufactured.

The phosphor layer 32 is adjusted so as not to transmit a light output from the semiconductor light-emitting chip 2 by adding the phosphor material in the matrix for a prescribed concentration. Considering balance between thickness of the phosphor layer 32 and light output from the semiconductor light-emitting chip, the concentration of the phosphor material in the phosphor layer 32 is preferred to be 20 wt % or more. For instance, 50 wt % or more of silicate based phosphor material is added into the matrix formed of a resin, and it is enabled to adjust not to transmit the light outputted from the semiconductor light-emitting chip 2. Furthermore, since bubbles are easy to be contained and it becomes hard to maintain the shape and to make a smooth boundary surface when concentration of the phosphor material is too high, the upper limit of concentration of the phosphor material in the phosphor layer 32 becomes around 90 wt %.

Furthermore, by changing a particle diameter of the phosphor particles contained in the phosphor layer 32, a desired effect can be obtained. For instance, when using the phosphor particles having a diameter of 10 to 20 μm (average particle diameter 15 μm), since the homogeneous phosphor layer can be manufactured easily and thickness and shape of the layer are easily controllable. In the case of using phosphor particles having a diameter of 20 to 45 μm (average particle diameter 30 μm), light-emitting intensity and light-emitting are especially enhanced. In some cases, the phosphor particles having larger diameter can be used also. In the case of using phosphor particles having a diameter of 45 to 70 μm (average particle diameter 50 μm), absorbance of the phosphor particles is enhanced caused by the diameter of the particles to reduce the number of phosphor particles. For that reason, re-absorption by the phosphor particles is reduced and luminescence efficiency is enhanced.

Furthermore, in the case YAG:Ce as the phosphor material, by using nano-particles (50 nm or less), scattering of light caused by the phosphor particles is reduced, and the luminescence efficiency is enhanced.

The second light transmissible layer 33 can be formed of a resin or a glass layer having light transmissibility. For the second light transmissible layer 33, a material having high in both of light transmissibility and heat resistance can be used. For instance, silicone resin, epoxy resin, urea resin, fluororesin, acrylic resin, polyimide resin, or glass can be given. Especially, the epoxy resin or the silicone resin is the most suitable for the second light transmissible layer 33 since they are easily available, easy to handle, and inexpensive.

The second light transmissible layer 33 can be formed by the same substance+ or a material having the same refractive index as that of the first light transmissible layer 31 or the matrix constituting the phosphor layer 32. Otherwise, the second transmissible layer 33 may be formed by using a material having a lower refractive index than that of the first light transmissible layer 31 or the matrix constituting the phosphor layer 32. In this case, the refractive index changes stepwise in the device, and a difference of the refractive index in the air-light transmissible layer 33 interface becomes smaller. As a result, the total reflection is reduced, and since light extraction efficiency is further improved, this becomes more preferable.

The shape of the outer periphery in the cross-section of the second light transmissible layer 33 can be either one semi-arc-shaped, palabola-shaped, or U-shaped, or cornered shaped having at least two straight lines. Although there is no limitation in the thickness of the second light transmissible layer 33 as far as it is equal or more than large enough to completely cover the semiconductor light-emitting chip 2, the first light transmissible layer 31, and the phosphor layer 32, it is preferable that the thickness of the layer is 20 to 500 μm. Furthermore, it is preferable that the height of the multilayered structure covering the semiconductor light-emitting chip 2 is from 0.25 times to one time as much as the width of the bottom surface. Within such a range, light extraction efficiency can be improved sufficiently.

Figure 10A:
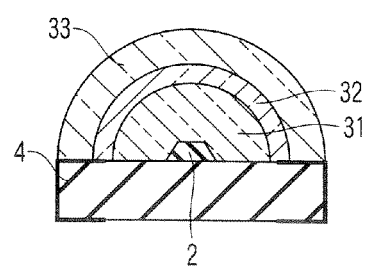
FIGS. 10A to 10C are cross-sectional views illustrating a semiconductor light-emitting device according to other embodiment.

Considering the light extraction efficiency, the shape of the outer periphery of the cross-section of the second light transmissible layer 33 is semi-arc-shaped. The light extraction efficiency here means a reflective index and a transmission index of light from the semiconductor light-emitting chip in the air-resin interface. For instance, the second light transmissible layer 33 having the cross-section of the semi-arc-shaped outer periphery can be formed by meeting the edge of the second light transmissible layer 33 with the outline of the substrate 4 as shown in FIG. 10A. For instance, by the following method, the edge of the second light transmissible layer 33 can be coincided with the outline of the substrate 4. Firstly, the substrate is heated to the curing temperature of the resin, and applying the resin by a dispenser and solidifying the resin at nearly the same time, it can be molded in a semi-arc shape due to the surface tension.

Figure 10B:
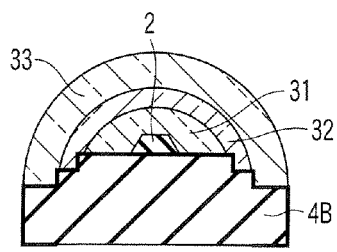

Otherwise, by using the substrate to which working is applied on the shape of the surface, the edge of the second light transmissible layer can be coincided with the outline of the substrate also. Concretely, the substrate 4B having a convex part shown in FIG. 10B on the surface is used. In the convex part in the substrate 4B, the region of the phosphor layer 32 becomes the convex part of a first step, and the region of the first light transmissible layer 31 becomes the convex part of a second step. By meeting the edges of the layer of the first light transmissible layer 31 and the phosphor layer 32 with the outline of the respective steps of the substrate, the multilayered structure shown in FIG. 10B is formed.

Figure 10C:
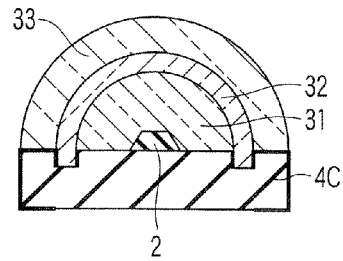

Furthermore, the substrate 4C in which the groove is formed as shown in the FIG. 10C may be used. On the surface of the substrate 4c, the groove of a cocentric circle centered in a semiconductor light-emitting chip mount part is installed. The first light transmissible layer 31 is formed in the region inside the groove, and the phosphor layer 32 is formed in the region of the groove. Furthermore, in that outside region, the second light transmissible layer 33 is formed.

Furthermore, it is also useful to install a difference in wettability in the concentric circle on the surface of the substrate. As it goes further inside, affinity to the resin become higher. Depending on the resin forming the light transmissible layer, a surface treatment is applied so as to become hydrophilic or hydrophobic. For instance, in the case of using silicone resin, by selectively coating the substrate with fluoric coating, hydrophobic treatment (repelling treatment by silicone) can be applied.

By surface tension, the first light transmissible layer 31 and the phosphor layer 32 are formed respectively in the regulated regions. As a result, the structure shown in FIG. 10A can be formed easily.

In the case the laminated structure comprising the first light transmissible layer 31, the phosphor layer 32, and the second light transmissible layer 33 is formed inside the recess, efficiency is reduced by returning light from the side surface of this recess. Concretely, this is the case the cup shaped substrate is used. Since the inner peripheral face of the cup is a reflecting plate, returning light from this reflecting plate to the semiconductor light-emitting chip occurs, and efficiency is reduced.

On the contrary, in the case of a flat plate substrate or a convex shaped substrate, since there is no returning light to the chip, reduction of efficiency can be evaded.

Since the second light transmissible layer 33 has been installed between the phosphor layer 32 and air, re-absorption is reduced.

Figure 11:
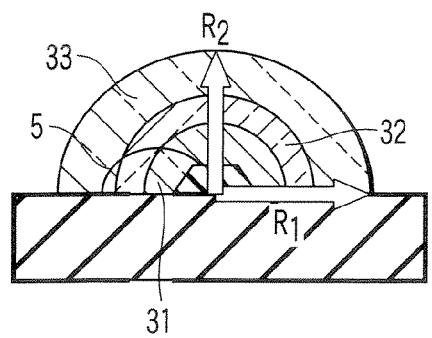
FIG. 11 is a diagram drawing explaining the shape of a multilayered structure.

In the semiconductor light-emitting device of this embodiment, there is a preferable range in radius and height of the laminated structure. In the FIG. 11, the radius and the height of the laminated structure is shown respectively by $R_1$ and $R_2$. The radius $R_1$ is a distance from the center of the semiconductor light-emitting chip 2 to the outer periphery of the second light transmissible layer 33 on the surface of the substrate 4, and the height $R_2$ is a distance from the plane surface for the semiconductor light-emitting chip of the substrate 4 to be mounted to the top of the second light transmissible layer 33.

As for the current manufacturing method, it has been found by the inventors that $R_1$=500 to 1,500 μm is most suitable. Furthermore, in the case of molding, there is no limit in the maximum value.

The efficiency is enhanced approximately to the degree exceeding 1.3 times as much as that before molding of $R_1$ within a range of $1/2 (R_1) < R_2 < 2R_1$. That is the case the respective layers have the height within a range from 0.25 to one times as much as the diameter of the bottom face. In the case of shifting out of this range, concretely, in the case of being longitudinally long or laterally long, the total reflection increases and the efficiency is reduced.

As described above, in the semiconductor light-emitting device of the embodiment, the multilayered structure covering the semiconductor light-emitting chip can be constituted in various shapes. The multilayered structure can be formed by an arbitrary method depending on the shape.

Figure 12:
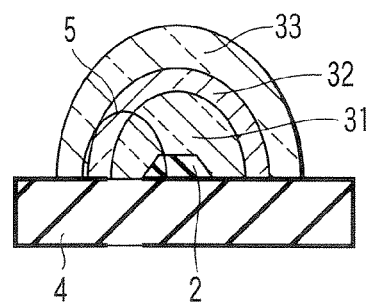
FIG. 12 is a cross-sectional view illustrating a semiconductor light-emitting device according to another embodiment.

In FIG. 12, the multilayered structure of which the shape of the outer periphery in the cross-section is parabolic is shown. The multilayered structure of such a shape is easy to be molded in a desired shape by controlling viscosity and temperature of the resin, and for instance, this can be manufactured by the following method. Firstly, the semiconductor light-emitting chip 2 is mounted onto the plane surface for the semiconductor light-emitting chip of the substrate 4 to be mounted. The first main electrode of the semiconductor light-emitting chip 2 and the wiring 42 of the substrate 4 are electrically connected and the second main electrode and the wiring 43 are electrically connected via the wire 5. Afterwards a lighting test of the semiconductor light-emitting chip 2 is carried out.

After the lighting test, using a dispenser, the resin is dripped to coat the surface of the substrate 4 in which the lighting confirmation has been carried out. Immediately after coating, the multilayered structure is manufactured by curing the resin. By adjusting the viscosity of the resin, surface tension of the resin, wettability of the substrate or temperature or the like, the outer peripheral shape in the cross section of the multilayered structure 3 can be made parabolic. In order to obtain such a shape, for instance, the viscosity of the resin can be made approximately at 2 to 10 Pa·s. Furthermore, it is adequate that the temperature is made to be the ordinary temperature (25° C.) to 200° C. depending on the curing of the resin.

Figure 13:
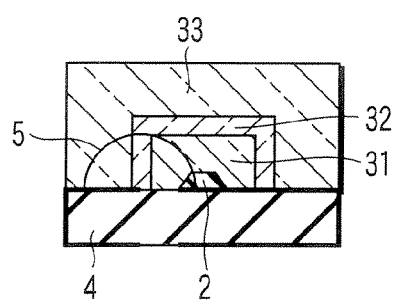
FIG. 13 is a cross-sectional view illustrating a semiconductor light-emitting device according to another embodiment.

In FIG. 13, the semiconductor light-emitting device having the multilayered structure 3 of which the shape of the cross-section is rectangular is shown. The multilayered structure 3 having this shape can be manufactured easily, for instance, by molding the first light transmissible layer 31, the phosphor layer 32, and the second light transmissible layer 33 successively on the substrate 4 on which the semiconductor light-emitting chip 2 is mounted. The outer periphery on the cross-section perpendicular to the substrate plane surface of the multilayered structure in the semiconductor light-emitting device shown in FIG. 13 includes three straight lines, and the space defined by such outer periphery and the surface of the substrate 4 becomes rectangular.

Otherwise, by adopting the following method, the multilayered structure 3 may be formed of which the cross-section perpendicular to the substrate plane surface is rectangular. In this case, firstly the multilayered structure 3 shown in FIG. 13 is manufactured by successively molding the resins to become raw materials of respective layers. Afterwards, by mechanically bonding the multilayered structure 3 on the substrate 4, the multilayered structure 3 can be arranged on the plane surface for the semiconductor light-emitting chip of the substrate 4 to be mounted. Bonding can be carried out by arranging a resin adhesive having a similar composition to that of the first light transmissible layer 31 between the surface of the substrate 4 and the multilayered structure 3.

The second light transmissible layer 33 can be formed in a different shape from the outer peripheral shape in the cross-section of the first light transmissible layer 31. An example of a cross-section of the semiconductor light-emitting device including the first and the second light transmissible layers having such a shape is shown in FIG. 14.

Figure 14:
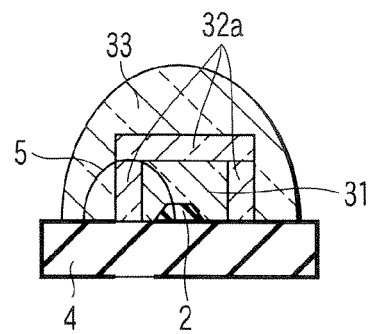
FIG. 14 is a cross-sectional view illustrating a semiconductor light-emitting device according to another embodiment.

In the semiconductor light-emitting device shown in FIG. 14, the cross-section perpendicular to the substrate plane surface of the first light transmissible layer 31 is rectangular, and the shape of the outer periphery in the cross-section perpendicular to the substrate plane surface of the second light transmissible layer 33 is parabolic. The multilayered structure having such a shape can be manufactured simply and easily by utilizing a tabular substance 32a formed of ceramics containing the phosphor particles on the substrate 4 on which the semiconductor light-emitting chip 2 is mounted. The position of the tabular substance of the ceramics containing the phosphor particles worked in an appropriate size is fixed by the resin used in the first light transmissible layer 31. Furthermore, while heating the resin that is the raw material of the second light transmissible layer 33, the second light transmissible layer 33 is formed by dripping the resin by the dispenser or the like. By such a method, the multilayered structure shown in FIG. 14 can be manufactured easily.

The present invention is explained further in details by showing concrete examples in the followings.

Firstly, the substrate made of AlN has been prepared as the substrate 4. This substrate 4 can be manufactured easily by mold processing. The semiconductor light-emitting chip 2 having an InAlGaN light-emitting layer emitting a blue light has been mounted on the plane surface for the semiconductor light-emitting chip of the substrate 4 to be mounted. The size of the used semiconductor light-emitting chip 2 is the bottom face of 300 μm square and a height of 120 μm. After electrically connecting between the wiring 42 of the substrate 4 and the semiconductor light-emitting chip 2 by the wire 5, the first light transmissible layer 31 was formed by the silicone resin on the substrate 4 while covering the semiconductor light-emitting chip 2. While heating the substrate at 150° C., the resin was dripped using the dispenser and cured. The first light transmissible layer 31 of which the outer peripheral shape of the cross-section is parabolic and of which the thickness was 600 μm was finally manufactured.

Next, the phosphor layer 32 was formed. The silicone resin was used as the matrix, and a raw material for phosphor layer was obtained by adding the yellow phosphor material $(Sr, Ca, Ba)_2SiO_4$:Eu having the average particle diameter of 30 μm at a concentration of 75 wt % to this matrix. While heating the substrate 4 at 150° C. in which the first light transmissible layer 31 has been formed, it was cured by dripping the f raw material using the dispenser. By this, the phosphor layer 32 of which the outer peripheral shape of the cross-section is parabolic and of which the thickness is 100 μm was manufactured.

Furthermore, the second light transmissible layer 33 was formed using the silicone resin. While heating the substrate having the first light transmissible layer 31 and the phosphor layer 32 at 150° C., the silicone resin is dripped by the dispenser and cured. By this, finally the second light transmissible layer 33 is formed of which the outer peripheral shape of the cross-section perpendicular to the substrate plane surface is parabolic and of which the thickness is 300 μm. By the above step, the semiconductor light-emitting device shown in FIG. 1 was obtained.

By applying an operating voltage between the main electrodes of the semiconductor light-emitting chip 2, the blue light was emitted. It was irradiated to the phosphor layer 32 from the semiconductor light-emitting chip 2 via the light transmissible layer 31, absorbed a part of the blue light in the phosphor layer 32 and yellow light was emitted, and the semiconductor light-emitting device 1 emitted white light via the second light transmissible layer 33.

In the semiconductor light-emitting device of the examples, this is a structure in which loss due to absorption of light inside the device is reduced. Since of this, exciting light emitted from the semiconductor light-emitting chip can be used effectively and light can be emitted at a high efficiency.

Furthermore, the raw material for phosphor layer can be prepared by adding a yellow phosphor material $(Sr, Ca, Ba)_2SiO_4$:Eu having the average particle diameter of 50 μm to the silicone resin at the concentration of 75%. Apart from using the raw material prepared in this way, the semiconductor light-emitting device can be made in the same way as the above. An efficiency of the obtained semiconductor light-emitting device is expected to have approximately 10% improvement than the above described case. The average particle diameter of the phosphor particles used here is 50 μm and it is larger than the above 30 μm. As the average particle diameter of the phosphor particles becomes larger, absorbance of the phosphor particles is improved and the number of the phosphor particles is decreased. For that reason, it is estimated that re-absorption by the phosphor particles reduced and luminescence efficiency was improved.

For the purpose of comparison, the semiconductor light-emitting device was manufactured in a same constitution except that the first light transmissible layer 31 is not formed (comparative example 1). When similarly driving the semiconductor light-emitting device of this comparative example 1, efficiency of the emitted light is 80% of that in the case of the semiconductor light-emitting device of the example. Furthermore, the semiconductor light-emitting device was manufactured in a same constitution except that the second light transmissible layer 33 is not formed (comparative example 2). When similarly driving the semiconductor light-emitting device of this comparative example 2, efficiency of the emitted light was 80% of that in the case of the semiconductor light-emitting device of the example. Furthermore, the semiconductor light-emitting device was manufactured in a same constitution except that the substrate 4 was changed to the cup, efficiency of the emitted light was 80% of that in the case of the semiconductor light-emitting device of the example (comparative example 3). When similarly driving the semiconductor light-emitting device of this comparative example 3, efficiency of the emitted light was 80% of that in the case of the semiconductor light-emitting device of the embodiment.

In the semiconductor light-emitting device 1 according to the embodiment, since this has a simple structure of the semiconductor light-emitting chip 2 and a plurality of thin layers made of resin, the number of parts is less, and it is possible to realize downsizing and high luminance.

Although in the above described examples, thicknesses of the first light transmissible layer 31, the phosphor layer 32 and the second light transmissible layer 33 were made 600, 100, and 300 μm respectively, it is not restricted to this. It can be changed appropriately depending on the size or the like of the semiconductor light-emitting chip 2. For instance, in the case the size of the semiconductor light-emitting chip 2 is as large as 400 μm, the thicknesses of the first light transmissible layer 31, the phosphor layer 32, and the second light transmissible layer 33 can be changed to 800, 50, and 600 μm, respectively. In this case, there is an advantage that it can be manufactured easily at a high yield. Furthermore, the obtained luminescence efficiency of the semiconductor light-emitting device is further improved. On the other hand, in the case the size of the semiconductor light-emitting chip 2 is as small as 200 μm, thicknesses of the first light transmissible layer 31, the phosphor layer 32, and the second light transmissible layer 33 can be changed to 400, 100, and 100 μm. In this case, light-emitting luminance can be further improved. As long as there is thickness enough to completely cover the semiconductor light-emitting chip 2 and within a range of the above $1/2\ (R_1)<R_2<2R_1$, there is no limit in particular in the thickness of the first light transmissible layer 31, the phosphor layer 32, and the second light transmissible layer 33.

In the semiconductor light-emitting device of the embodiment, a third light transmissible layer may be further formed on the second light transmissible layer 33. The cross-section of such a structure is shown in FIG. 15A and FIG. 15B.

Figure 15A:
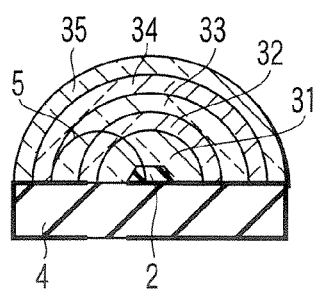
FIGS. 15A and 15B are cross-sectional views illustrating a semiconductor light-emitting device according to another embodiment.
Figure 15B:
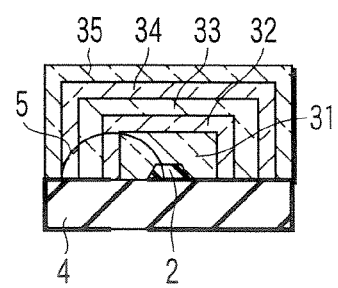

In the semiconductor light-emitting device shown in FIG. 15A, on the substrate at which the semiconductor light-emitting chip 2 is mounted, the first light transmissible layer 31, the phosphor layer 32, the second light transmissible layer 33 the third light transmissible layer 34, and the fourth light transmissible layer 35 are formed successively. As shown in FIG. 15B, the cross-section of such a multilayered structure may be made rectangular.

It is preferable that the refractive index of the third light transmissible layer 34 is set to be lower than that of the second light transmissible layer 33 and that the refractive index of the fourth light transmissible layer 35 is set to be lower than the refractive index of the third light transmissible layer 34. By forming the third light transmissible layer and the fourth light transmissible layer on the second light transmissible layer like this, extraction efficiency of light can be further improved.

For instance, in the structure shown in FIG. 14A, in the case the refractive indexes of the first light transmissible layer 31, the phosphor layer 32 and the second light transmissible layer 33 are all set to be 1.52, the refractive index of the third light transmissible layer 34 can be set to be 1.42. At this time, the refractive index of the fourth light transmissible layer 35 is desired to become around 1.2 to 1.4. The refractive indexes of the respective layers can be adjusted, for instance, using a plurality of silicone resins having different substituting groups.

By further forming the third light transmissible layer by using such different silicone resins and changing the refractive index stepwise, the effect of suppressing the total reflection of light becomes further greater. As a result, the luminescence efficiency (light extraction efficiency) is further improved than that in the case of a simple trilaminar structure comprising the first light transmissible layer 31, the phosphor layer 32, and the second light transmissible layer 33.

Figure 16A:
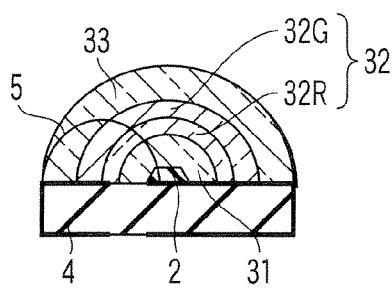
FIGS. 16A and 16B are cross-sectional views illustrating a semiconductor light-emitting device according to another embodiment.

In the semiconductor light-emitting device of other embodiments, the phosphor layer of two layers or more may be included. Since a plurality of the phosphor layers is present, light from the semiconductor light-emitting chip is absorbed more effectively, and luminescence efficiency can be improved. The cross-section view of those examples is shown in FIG. 16A.

In the shown semiconductor light-emitting device, on the substrate 4 at which the semiconductor light-emitting chip 2 is installed, the first light transmissible layer 31, the phosphor layer 32, and the second light transmissible layer 33 are successively formed. The phosphor layer 32 is constituted of a laminated layer of a red phosphor layer 32R containing a red phosphor particles and a green phosphor layer 32G containing a green phosphor particles.

Concretely, a blue light-emitting chip having an InGaN light-emitting layer is used as the semiconductor light-emitting chip 2, and $CaAlSiN_3$:Eu and $(Sr, Ca, Ba)_2SiO_4$:Eu can be used respectively as the red phosphor particles and the green phosphor particles. In the case of such constitution, while retaining luminescence efficiency, an LED high in color reproducibility can be obtained.

Figure 16B:
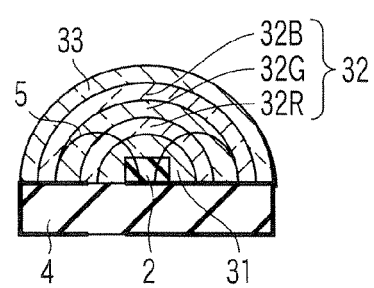

Otherwise, as shown in FIG. 16B, the phosphor layer 32 can be constituted of the trilaminar structure of the red phosphor layer 32R containing the red phosphor particles, the green phosphor layer 32G containing the green phosphor particles, and the blue phosphor layer 32B containing the blue phosphor particles. In the case of using three phosphor particles of red, green, and blue, the obtained color reproducibility of the semiconductor light-emitting device is further improved. Furthermore, since red, green and blue are successively laminated from the inside of the multilayered structure in the phosphor layer, re-absorption of light can be reduced more than the case of a structure in which a single phosphor layer is formed by mixing these three colors of phosphor particles. As a result, high luminescence efficiency can be obtained.

Figure 17:
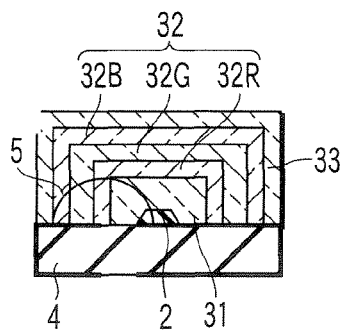
FIG. 17 is a cross-sectional view illustrating a semiconductor light-emitting device according to another embodiment.

The multilayered structure including the red phosphor layer, the green phosphor layer, and the blue phosphor layer may have a rectangular cross-section as shown in FIG. 17. By the following method, the semiconductor light-emitting shown in FIG. 17 device was fabricated.

Firstly, as the semiconductor light-emitting chip 2, a near-ultraviolet light-emitting LED chip having a light-emitting layer of GaN on the substrate 4 by a conventional method. On the semiconductor light-emitting chip 2, the first light transmissible layer 31 was formed by coating the silicone resin and curing. In doing this, the first light transmissible layer 31 was fabricated by solidifying it by a mold.

On the first light transmissible layer 31, the red phosphor layer 32R including the red phosphor particles, the green phosphor layer 32G including the green phosphor particles, and the blue phosphor layer 32B including the blue phosphor particles were successively formed, thereby obtaining the phosphor layer 32. As the red phosphor particles, the green phosphor particles, and the blue phosphor particles, $La_2O_2S$:Eu, $BaMg_2Al_{16}O_{27}$:Eu, Mn, and $(Sr, Ca, Ba)_{10}(PO_4)_6Cl_2$:Eu were used, respectively.

In forming the phosphor layer, by blending the respective phosphor particles with the silicone resin, the filmed phosphor layers were prepared, and these were laminated. By using the filmed phosphor layer, a multilayered complicated shape can be fabricated easily.

By making the cross-section rectangular, the device can be fabricated more easily and manufactured inexpensively. In bonding the first light transmissible layer 31 and the respective phosphor particles films, it is desired that a small amount of the silicone resin is thinly coated on a boundary. By this, the strong device with less light loss can be fabricated.

As described above, by installing a plurality of phosphor layers, adjustment of the phosphor particles amount and a luminous color of the device become easier. The respective phosphor layers are set to be different in phosphor particles kinds or to have different concentrations. By using a plurality of phosphor particles, color rendering can be improved. Furthermore, in the case kinds of the phosphor particles are different, a structure in which the phosphor particles to emit light of a longer wavelength is arranged in the inner layer is desirable. By installing a plurality of the phosphor layers in this order, light absorption by the phosphor particles can be suppressed, and light extraction efficiency can be improved.

Figure 18A:
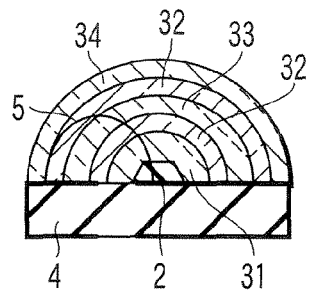
FIGS. 18A and 18B are cross-sectional views illustrating a semiconductor light-emitting device according to another embodiment.
Figure 18B:
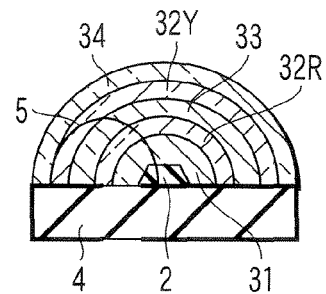

Furthermore, it can be used concomitantly with a structure comprising a plurality of the above described light transmissible layers. One of such examples is shown in FIG. 18A and FIG. 18B. In the semiconductor light-emitting device shown in FIG. 18A, on the substrate 4 in which the semiconductor light-emitting chip 2 is installed, the first light transmissible layer 31, the phosphor layer 32, the second light transmissible layer 33, the phosphor layer 32, and the third light transmissible layer 34 are successively formed. In this case, two phosphor layers 32 can contain the same kind of phosphor particles. Furthermore, in the semiconductor light-emitting device shown in FIG. 18B, on the substrate 4 in which the semiconductor light-emitting chip 2 is installed, the first light transmissible layer 31, the red phosphor layer 32R including the red phosphor particles, the second light transmissible layer 33, the yellow phosphor layer 32Y including the yellow phosphor particles, and the third light transmissible layer 34 are successively formed.

In the case of such a structure, light extraction efficiency is enhanced more.

Figure 19:
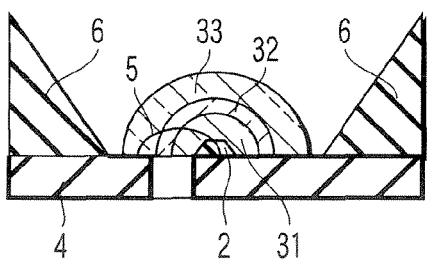
FIG. 19 is a cross-sectional view illustrating a semiconductor light-emitting device according to another embodiment.

A semiconductor light-emitting device according to other embodiment furthermore is shown in FIG. 19. In the semiconductor light-emitting device shown in the drawing, a reflecting plate 6 is installed at the outside of a second light transmissible layer 33. The reflecting plate 6 efficiently guides light emitted from the second light transmissible layer 33 into an arbitrary direction. As a result, the directivity of the light is enhanced, and color unevenness can be reduced still more. The reflecting plate 6 can be formed of a material excellent in thermal conductivity. Especially, it is desired that heat generated by the action of the semiconductor light-emitting chip 2, and for instance, Cu, AlN, $Al_2O_3$, BN, plastics, ceramics and diamond are notified. In order to enhance the reflectivity, reflecting coating of Ag or the like may be formed on the surface of the reflecting plate.

The reflecting plate 6 can be formed of another member (other parts) different from the substrate 4 and it can be fixed mechanically to the substrate 4 by an adhesive, tightening member or the like. Otherwise, the reflecting plate 6 may be constituted by integrated molding with the substrate 4.

Figure 20:
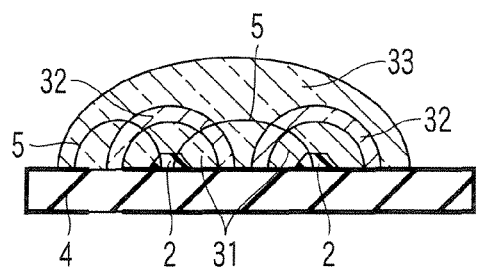
FIG. 20 is a cross-sectional view illustrating a semiconductor light-emitting device according to another embodiment.

In the semiconductor light-emitting device according to the embodiment, a multiple chip module structure as shown in FIG. 20 may be adopted.

Figure 21:
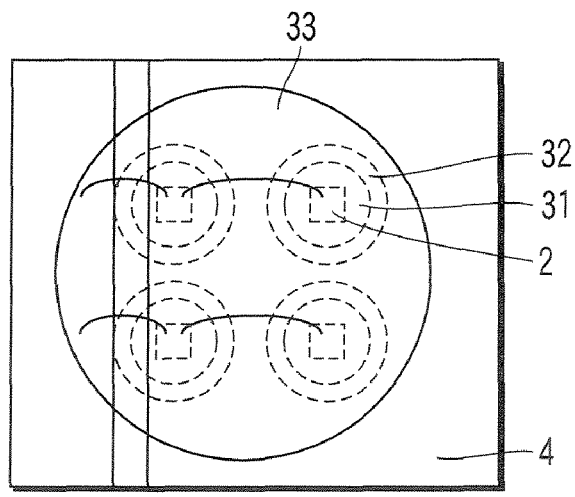
FIG. 21 is a plan view of the semiconductor light-emitting device shown in FIG. 20.

In the semiconductor light-emitting device 1 shown in FIG. 20, four semiconductor light-emitting chips 2 are installed on the substrate 4 in parallel. On the respective semiconductor light-emitting chip 2, a first light transmissible layer 31 and a phosphor layer 3 are respectively installed. The four semiconductor light-emitting chips 2 are collectively covered by the second light transmissible layer 33. A plan view of such a semiconductor light-emitting device 1 is shown in FIG. 21.

Figure 22:
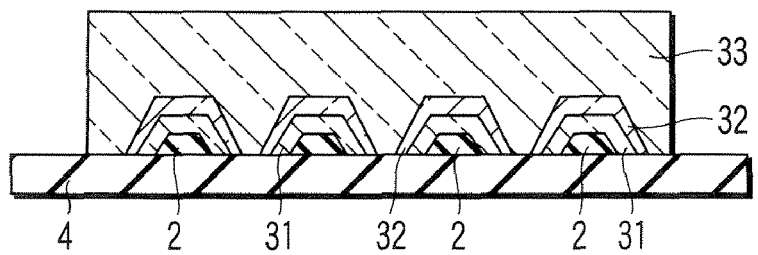
FIG. 22 is a cross-sectional view illustrating a semiconductor light-emitting device according to another embodiment.
Figure 23:
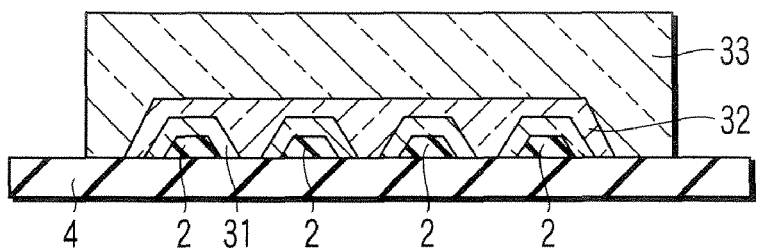
FIG. 23 is a cross-sectional view illustrating a semiconductor light-emitting device according to another embodiment.

The number of the semiconductor light-emitting chip 2 can be changed appropriately and arranged in an arbitrary shape. For instance as shown in FIG. 22, four semiconductor light-emitting chips 2 may be arranged in a straight line. On respective light-emitting chip, the first light transmissible layer 31 and the phosphor layer are successively formed. The second light transmissible layer 33 is formed covering the four phosphor layers 32 collectively. Otherwise, as shown in FIG. 23, individual semiconductor light-emitting chips can be covered only by the first light transmissible layer 31. The phosphor layer 32 and the second light transmissible layer 33 collectively cover four first light transmissible layers 31.

As above described in details, in the semiconductor light-emitting device according to the embodiment, since the semiconductor light-emitting chip mounted on the substrate is covered by a multilayered structure including the first light transmissible layer, the phosphor layer, and the second light transmissible layer, a highly efficient output of light with high luminance has been enabled. Usage of the semiconductor light-emitting device according to the embodiment is not limited only to the above described examples, but can be applied to various applications. For instance, it can be applied to general illumination appliances, office use illumination fixtures, or back lights for liquid crystal display devices of televisions or personal computers, and in addition, to lighting fixtures for automobiles, motorcycles, or bicycles or the like. In respective cases, light with high luminance can be outputted at a high output.

According to the embodiments of the present invention, a semiconductor light-emitting device is provided in which light of high luminance can be outputted at a high efficiency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light-emitting device comprising:
a substrate having a plane surface;
a semiconductor light-emitting element mounted on the plane surface of the substrate and which emits light in a range from ultraviolet ray to visible light;
laminated structure which covers the semiconductor light-emitting element and contacts the plane surface of the substrate, the structure having a radius R1 and a height R2, where R1 and R2 satisfy ½(R1)<R2<2R1, the laminated structure comprising:
a first light transmissible layer;
a phosphor layer which covers the first light transmissible layer, the phosphor layer contacting with the plane surface of the substrate and containing phosphor particles and matrix, a surface of the phosphor layer having unevenness reflecting shapes of the phosphor particles, the phosphor particles having a diameter ranging from 45 μm to 70 μm; and
a second light transmissible layer which covers the phosphor layer and contacting with the plane surface of the substrate,
wherein the phosphor particles are contained in the phosphor layer at a concentration of 20 wt % or more.

2. The light-emitting device according to claim 1, wherein the phosphor layer has a cross-section perpendicular to the plane surface of the substrate, a shape of an inner periphery of the cross-section being either semi-arc-shaped, parabola-shaped, or U-shaped, or cornered-shaped having at least two straight lines.

3. The light-emitting device according to claim 1, wherein the first light transmissible layer has a cross-section perpendicular to the plane surface of the substrate, a shape of an outer periphery of the cross-section being either semi-arc-shaped, parabola-shaped, or U-shaped, or cornered-shaped having at least two straight lines.

4. The light-emitting device according to claim 1, wherein the second light transmissible layer has a cross-section perpendicular to the plane surface of the substrate, a shape of an outer periphery of the cross-section being either semi-arc-shaped, parabola-shaped, or U-shaped, or cornered-shaped having at least two straight lines.

5. The light-emitting device according to claim 1, further comprising at least one another phosphor layer adjacent to the phosphor layer or inside of the first light transmissible layer or outside of the second light transmissible layer, the phosphor particles contained in respective phosphor layers being different in at least one of kind and concentration.

6. The light-emitting device according to claim 1, further comprising a third light transmissible layer above the second light transmissible layer, a refractive index of the third light transmissible layer being different from that of the second light transmissible layer.

7. The light-emitting device according to claim 1, further comprising at least one another phosphor layer between the first and second light transmissible layers, and a third light transmissible layer being sandwiched between adjacent phosphor layers.

8. The light-emitting device according to claim 1, wherein an edge of the second light transmissible layer coincides with an outline of the substrate.

9. The light-emitting device according to claim 1, wherein the unevenness occurs at a top part of the phosphor layer.

10. The light-emitting device according to claim 1, wherein the matrix is a resin.

11. The light-emitting device according to claim 10, wherein a reduced trailing of the resin occurs in a trailing part of the phosphor layer.

12. The light-emitting device according to claim 1, wherein the second light transmissible layer is in contact with air.

* * * * *